United States Patent
Lin et al.

(10) Patent No.: US 9,028,628 B2
(45) Date of Patent: May 12, 2015

(54) WAFER-TO-WAFER OXIDE FUSION BONDING

(71) Applicant: International Business Machines Corporation, Armonk, NY (US)

(72) Inventors: Wei Lin, Albany, NY (US); Deepika Priyadarshini, Guilderland, NY (US); Spyridon Skordas, Wappingers Falls, NY (US); Tuan A. Vo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 13/826,229

(22) Filed: Mar. 14, 2013

(65) Prior Publication Data

US 2014/0261960 A1 Sep. 18, 2014

(51) Int. Cl.
*B32B 37/14* (2006.01)
*H01L 21/02* (2006.01)

(52) U.S. Cl.
CPC ...................................... *H01L 21/02* (2013.01)

(58) Field of Classification Search
CPC ....................................................... B32B 37/14
USPC ............................................................ 156/64
See application file for complete search history.

(56) References Cited

U.S. PATENT DOCUMENTS

| | | | |
|---|---|---|---|
| 4,506,184 A | 3/1985 | Siddall | |
| RE36,890 E | 10/2000 | Wells et al. | |
| 6,382,609 B1 | 5/2002 | Namioka et al. | |
| 6,833,312 B2 | 12/2004 | Yanagita et al. | |
| 7,378,332 B2 | 5/2008 | Tomita et al. | |
| 7,425,465 B2 | 9/2008 | Birkmeyer | |
| 7,713,369 B2 | 5/2010 | Aspar et al. | |
| 7,936,062 B2 | 5/2011 | Humpston et al. | |
| 8,119,500 B2 | 2/2012 | Yang et al. | |
| 8,133,799 B2 | 3/2012 | Osenbach et al. | |
| 2010/0122762 A1* | 5/2010 | George | 156/64 |
| 2011/0069467 A1 | 3/2011 | Flaim et al. | |
| 2011/0207291 A1 | 8/2011 | Tsuno et al. | |
| 2012/0288643 A1 | 11/2012 | Donis | |

OTHER PUBLICATIONS

Lin, W. et al, U.S. Appl. No. 13/908,510, filed Jun. 3, 2013.
Berthold, A., et al. "Wafer-to-wafer fusion bonding of oxidized silicon to silicon at low temperatures". Sensors and Actuators A 68 (1998) pp. 410-413. Copyright 1998 Elsevier Science S.A.

(Continued)

*Primary Examiner* — Daniel Lee
(74) *Attorney, Agent, or Firm* — Steven Meyers; David Zwick

(57) ABSTRACT

Oxide-oxide fusion bonding of wafers that includes performing a van der Waals force bonding process with a chuck having at least a flat central zone and an outer annular zone lower than the central zone, an edge portion of a mounted wafer is biased towards the outer annular zone. The van der Waals bonding wave is disrupted at the outer annular zone, causing an edge gap. A thermocompression bonding process is performed that includes heating the bonded wafers to a temperature sufficient to initiate condensation of silanol groups between the bonding surfaces, reducing the atmospheric pressure to cause degassing from between the wafers, applying a compression force to the wafers with flat chucks so as to substantially eliminate the edge gap, and performing a permanent anneal bonding process.

10 Claims, 8 Drawing Sheets

(56) References Cited

OTHER PUBLICATIONS

Cassidy, C. et al., Wafer-Bond Micro-Void Physical Analysis. Challenges for Three-Dimensional (3D) ICS and Systems. Workshop Program Monday, Nov. 28, 2011. <http://philippe.perdu.free.fr/workshops/workshop2011/3D/program.htm>.

Eichler, M., et al. "Effects on Silanol Condensation during Low Temperature Silicon Fusion Bonding". Journal of The Electrochemical Society. 156 (10) pp. H786-H793 (2009).

Heyvaert, I., et al. "Effect of oxide and W-CMP on the material properties and electromigration behaviour of layered aluminum metallisations". Microelectronic Engineering 50 (2000) pp. 291-299. Copyright 2000 Elsevier Science B.V.

Lin, W,. et al. U.S. Appl. No. 13/828,340, filed Mar. 14, 2013.

"Van der Waals force-Wikipedia, the free encyclopedia". [online] [retrieved on Dec. 13, 2012]. <http://en.wikipedia.org/wiki/Van_der_Waals_force>.

* cited by examiner

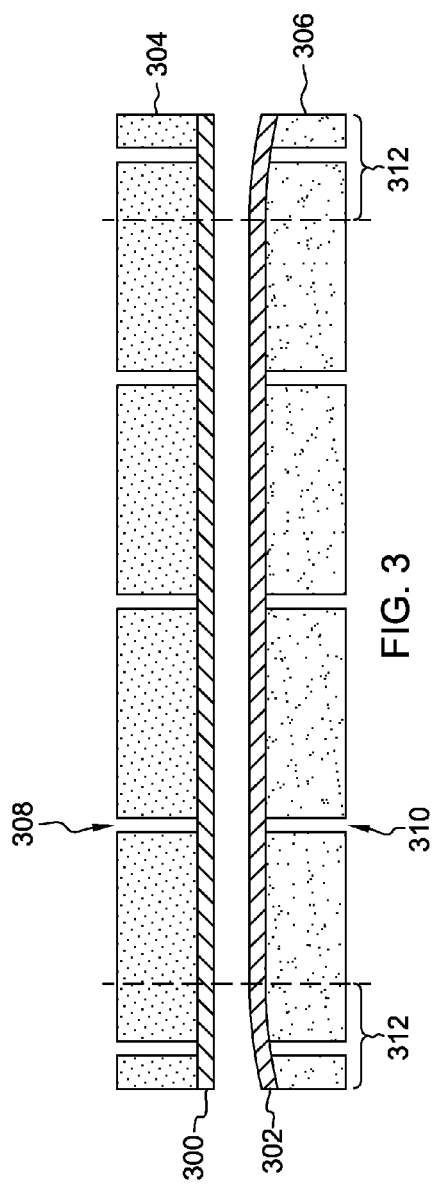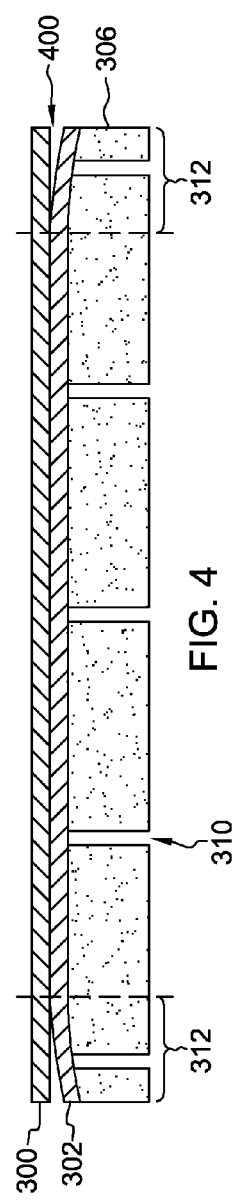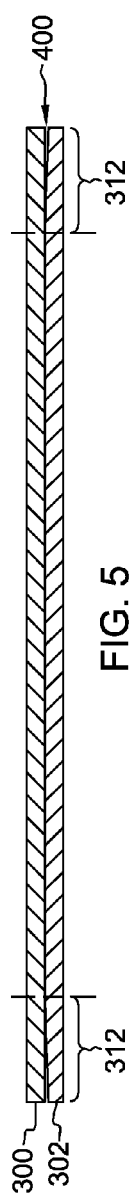

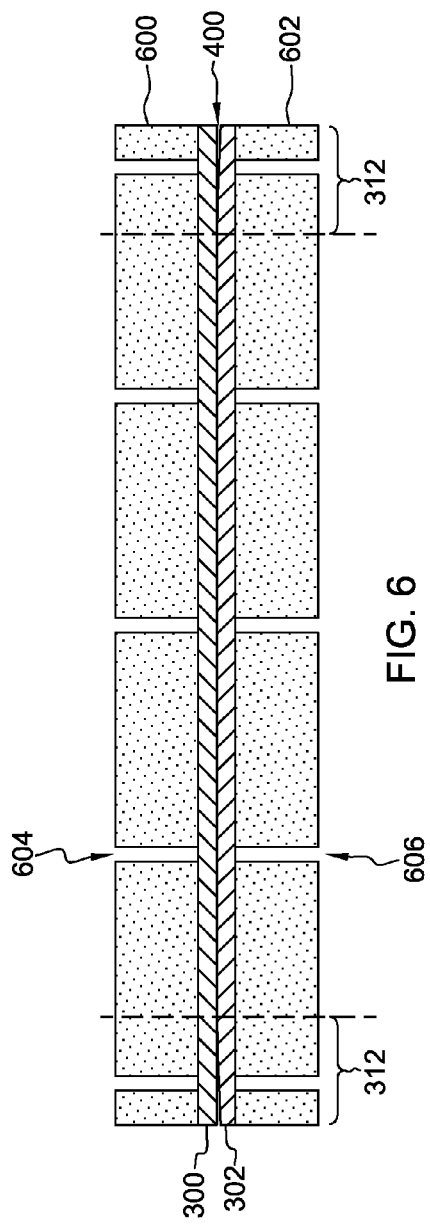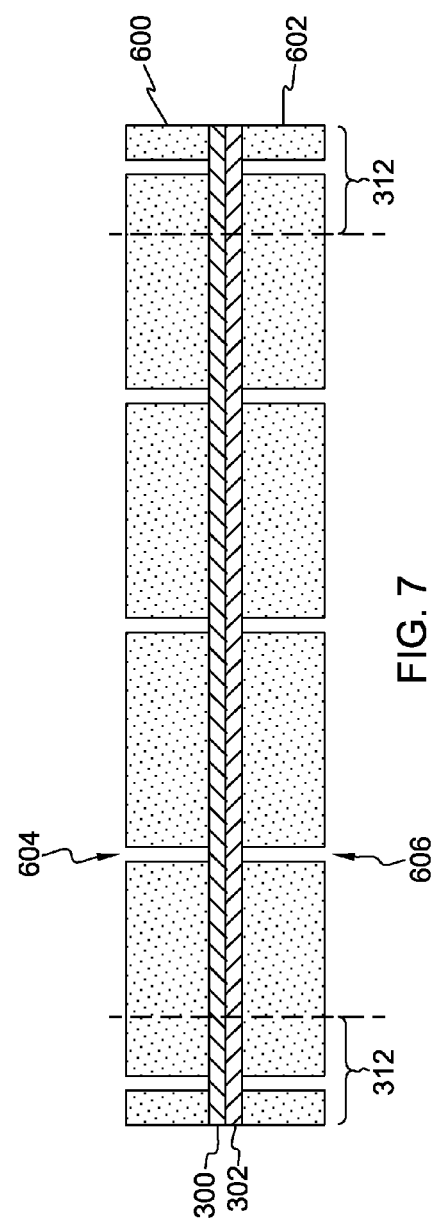

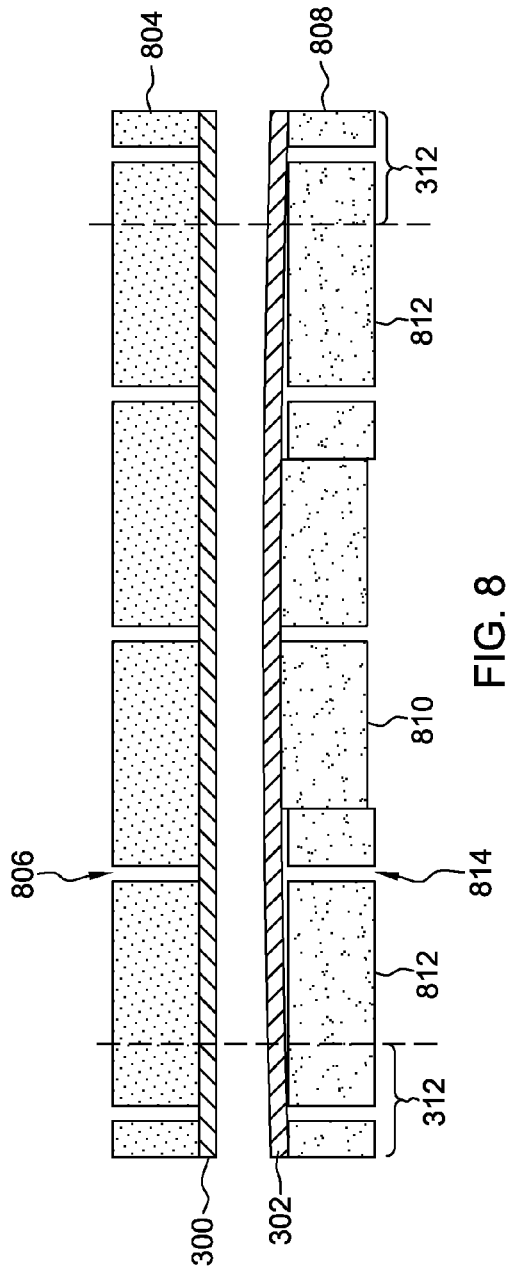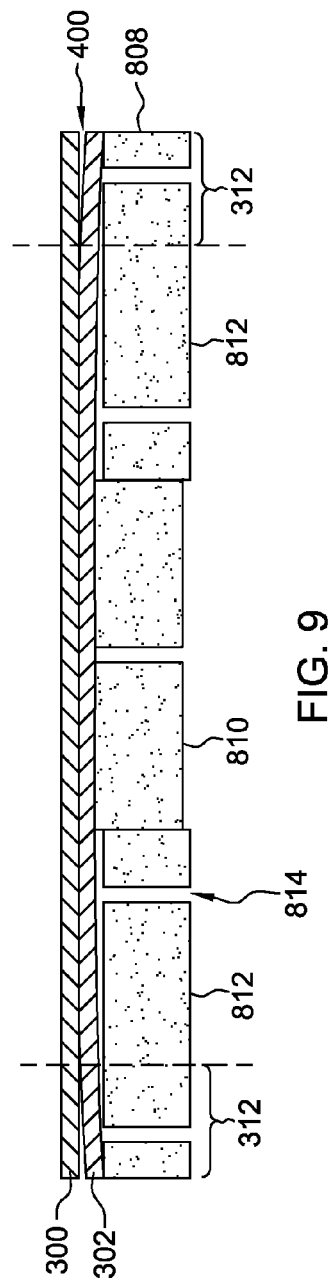

WAFER-TO-WAFER OXIDE FUSION BONDING

FIELD OF THE INVENTION

The present invention relates generally to the field of semiconductor device manufacturing, and more particularly to a process and apparatus for the bonding together of semiconductor substrates.

CROSS-REFERENCE TO RELATED APPLICATIONS

The present application is related to U.S. patent application Ser. No. 13/828,340, filed on Mar. 14, 2013, entitled "Wafer-to-Wafer Fusion Bonding Chuck".

BACKGROUND OF THE INVENTION

Semiconductor devices are typically produced in arrays on wafer substrates ranging from 1 to 18 inches in diameter. The devices are then separated into individual devices or dies that are packaged to allow practical macro-level connection of the devices in the context of a larger circuit. As the requirements for chip density and smaller packaging form factors increase, advances have been made in three-dimensional integration of circuits. In this technology, devices are stacked, and bonded in the vertical or z-direction. Typically, the stacked devices are electrically coupled by electrical contact pads on the devices.

A popular process for vertically integrating devices is a wafer-to-wafer integration scheme in which the devices on one wafer are aligned with the devices on another wafer, and the wafers are bonded together using oxide-oxide fusion bonding. One of the wafers is then thinned to expose through silicon vias that connect to the other wafer, or is thinned followed by fabrication of through silicon vias that connect to the other wafer. One of the challenges for oxide-oxide fusion bonding is chipping, cracking, and delamination at the wafer edge zone during thinning of wafer stacks caused by bonding voids and defects. This is typically handled by performing an edge trimming step to remove the defective edge zone after bonding or after preliminary thinning, which results in reducing usable space on the wafer and reducing yield. If the final device comprises multiple layers, additional edge trimming after each wafer-to-wafer bonding and/or thinning may further reduce yield.

It would be desirable to have a bonding process that reduces or eliminates defects in the edge zone caused by bonding voids and defects, thus increasing the manufacturing yield.

SUMMARY

Embodiments of the present invention disclose a method for oxide-oxide fusion bonding of two wafers, a bonding surface of each wafer being prepared for oxide-oxide fusion bonding. The method includes performing a van der Waals force bonding process between the bonding surfaces of the first and second wafers by at least mounting on a first chuck face of a first chuck a first wafer having a bonding surface facing away from the first chuck face, and mounting on a second chuck face of a second chuck a second wafer having a bonding surface facing away from the second chuck face. The second chuck face includes at least a flat central zone and an outer annular zone contiguous to the central zone, the outer annular zone being lower than the flat central zone such that an annular edge portion of the bonding surface of the second wafer that is mounted to the outer annular zone of the second chuck face is biased towards the outer annular zone. While the bonding surfaces of the first and second wafers are in opposed aligned close proximity to each other, biasing a center portion of the first wafer towards the second wafer such that a center portion of the bonding surface of the first wafer contacts a center portion of the bonding surface of the second wafer. The first wafer is released from the first chuck, and the first wafer snaps against the second wafer forming a van der Waals bonding wave propagating radially outward from the center contact portions of the bonding surfaces. The bonding wave is disrupted upon reaching the annular edge portion of the bonding surface of the second wafer that is biased towards the outer annular zone of the second chuck face, and the annular edge portion of the bonding surface of the second wafer and a corresponding annular edge portion of the bonding surface of the first wafer define an edge gap between the annular edge portions. The van der Waals force bonded first and second wafers are mounted between a third chuck having a flat chuck face, and a fourth chuck having a flat chuck face. In a process chamber, a thermocompression bonding process between the bonding surfaces of the first and second wafers is performed that includes heating the first and second wafers to a temperature at least sufficient to initiate condensation of silanol groups between the bonding surfaces of the first and second wafers, reducing the pressure of the atmosphere in the process chamber, applying a compression force to the first and second wafers with the third and fourth chucks so as to substantially eliminate the edge gap, and performing a permanent anneal bonding process between the bonding surfaces of the first and second wafers.

BRIEF DESCRIPTION OF THE SEVERAL VIEWS OF THE DRAWINGS

FIG. 3 is a cross-sectional view showing a pair of wafers loaded to initial bonding chucks, in accordance with an embodiment of the present invention.

FIG. 4 is a cross-sectional view showing the pair of wafers of FIG. 3 in an initial van der Waals force bonding state, in accordance with an embodiment of the present invention.

FIG. 5 is a cross-sectional view showing the pair of wafers of FIG. 4 released from the initial bonding chucks and in the initial van der Waals force bonding state, in accordance with an embodiment of the invention.

FIG. 6 is a cross-sectional view showing the pair of wafers of FIG. 5 loaded to flat bonding chucks in preparation for a thermocompression bonding processes, in accordance with an embodiment of the present invention.

FIG. 7 is a cross-sectional view showing the pair of wafers of FIG. 6 after a thermocompression bonding process, in accordance with an embodiment of the present invention.

FIGS. 8, 9, and 10 are cross-sectional views showing an adjustable dual-zone bonding chuck that may be an alternative to edge-sloped bonding chuck of FIG. 3, in accordance with an embodiment of the present invention.

DETAILED DESCRIPTION

Figure 1:
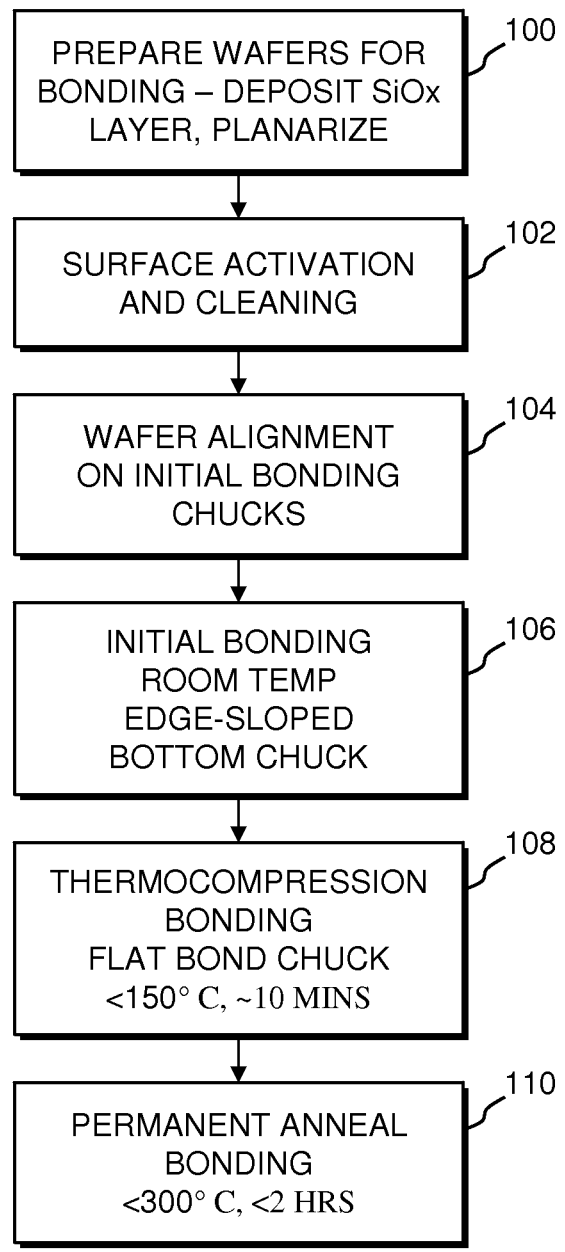
FIG. 1 is a flowchart illustrating steps of an oxide-oxide fusion bonding process, in accordance with an embodiment of the present invention.

Embodiments of the invention described in detail herein are directed to a process that improves oxide-oxide fusion bonding to reduce or eliminate edge chipping and cracking by enhancing the edge zone bonding at the wafer edge. In the disclosed embodiments, a low temperature thermocompression step is performed following the alignment and initial bonding steps, and before the permanent bonding anneal step. As further disclosed, the thermocompression step may be performed with the aid of a bonding chuck that, among its other possible advantages, operates to improve the oxide-oxide fusion bonding to reduce or eliminate edge chipping and cracking by enhancing the edge zone bonding.

It should be appreciated that although specific wafer substrate bonding process flows are described herein, such descriptions are exemplary only, and that the principles disclosed are also applicable to various types of conductive materials, dielectric and adhesive interface materials, and multiple types of semiconductor wafers and substrates. Such bonding may include arrangements such as face-to-face and face-to-back bonding, and such bonded structures may also incorporate microelectromechanical system (MEMS) structures as well.

For purposes of the description below, positional terms such as "upper", "lower", "right", "left", "vertical", "horizontal", "top", "bottom", etc., relate to the disclosed structures and methods, as oriented in the drawing figures, and should not necessarily be construed as limitations on embodiments.

A known shortcoming of the typical oxide-oxide fusion bonding process is defects in the edge zone, at the extant radial dimensions of a bonded wafer pair. Scanning acoustic microscopy, for example, ultrasonic C-mode scanning acoustic microscopy, has shown that the edge defects may be characterized, at least in part, by the aggregation of micro-voids at the wafer-wafer bonding interface. These micro-voids, which may have diameters of approximately 0.5 microns to approximately 100 microns or larger, are areas where bonding between wafers has not occurred. During mechanical thinning, unbonded areas easily fracture and rip off. The typical method of handling these edge defects is to accept them as a byproduct of the bonding process, and reduce their impact beyond their immediate vicinity by performing an edge trim of, for example, approximately 0.5 mm to approximately 10 mm. In the fabrication of vertically integrated devices involving multiple bondings, the cumulative effect of the required edge trimmings can result in a significant loss of otherwise usable wafer area.

The micro-void edge defects can result from artifacts that appear at the bond interface during an initial van der Waals bonding process, during the period between initial bonding and the permanent bonding anneal processes, and during the permanent bonding anneal process, and then may be sealed in place during the permanent bonding anneal process. One possible cause of the micro-void defects may be related to the relatively weak van der Waals force involved in the initial room temperature wafer-wafer bonding, particularly at the wafer edges. The van der Waals force is usually defined as the sum of the attractive and repulsive forces between molecules and atoms other than those due to chemical or atomic bonding between the molecules and atoms. The van der Waals force is a relatively weak force, and between molecules that exhibit dipole moments, the van der Waals force typically results in a weak attractive force. In the field of chip fabrication, a pair of properly prepared wafer faces will exhibit a van der Waals force attraction when the wafer faces are placed within sufficient proximity of each other at room temperature. In embodiments of the invention, the bond of the initial bonding process is a van der Waals force bond between the wafer faces.

Initial van der Waals force bonding is typically sufficient to allow for wafer alignment testing and transport to downstream processes. However, the van der Waals force is still comparatively weak, and special handling requirements must be observed. For example, a small opening force, such as the force imposed by a sharp blade at the bonding interface, may generally be enough to cause local delamination of the wafers. With the weak van der Waals temporary bonding force, it may be possible, for example, during wafer transport, wafer storage, and the annealing process, to create an interspace between the initially bonded wafer edges that is enough to allow air molecules and moisture to diffuse into the interspace. The interspace at the wafer edges may also be exacerbated by inherent wafer bowing and warpage, and by residual bowing forces resulting from, for example, the central pinning and edge release during the typical initial bonding process.

In addition, during the permanent bonding thermal anneal step, condensation of silanol groups generates water. During this step, out-gassing of the oxide bonding material can also occur. As such, gas pressure can build up in the wafer interspace, with the pressure gradient pointing from the center of the wafers towards the edge of the wafers. Because the edge zone may be a zone of weak bonding, this out-gassing can result in bubble aggregation in the edge zone. As the permanent bonding thermal anneal step progresses, these gas bubbles, as well as the diffused air and moisture molecules, can become trapped in the edge zone.

Other possible reasons why micro-void edge defects occur during the typical oxide-oxide fusion bonding process include potential deficiencies in residue removal at the edge during wafer surface cleaning, or/and deficiencies in plasma activation chamber design that can result in less effective plasma treatment at the wafer edges as compared to the wafer center. Also, bonding chuck designs can contribute to trapping of the gas bubbles and the diffused air and moisture molecules before they can fully out-gas from between the wafers.

With respect to the van der Waals force initial bond, the strength of the attractive force between the wafer surfaces falls away at least as the inverse of the square of the distance between the surfaces. As a result, and particularly close to the wafer surface radial edges, local wafer separations of approximately 1 nm may be enough to significantly reduce the van der Waals force between the separated surfaces, and may disrupt or inhibit the van der Waals force bonding wave of the initial bonding process, as described in more detail below. With respect to activated and cleaned silicon wafer surfaces, also discussed in more detail below, the van der Waals force predominantly results from a SiOH dipole-dipole interaction. Wafer surfaces in an initial van der Waals force bond state may be separated by approximately 3-4 Å. Because the van der Waals radii of O, N, CH4, and water vapor in air are approximately 1.5, 1.5, 1.2, and 2.8 Å, respectively, diffusion of these substances into the wafer-wafer interspace can occur, as mentioned above.

FIG. 1 is a flowchart illustrating steps of an oxide-oxide fusion bonding process, in accordance with an embodiment of the present invention. In preparation for bonding, the wafer surfaces to be bonded are deposited with silicon oxide layers, and then planarized using, for example, a chemical-mechanical polishing technique (step 100). In certain embodiments, the wafer surfaces to be bonded are not limited to those with extrinsically deposited silicon oxide layers, but may also include surfaces, such as glass substrates, having intrinsic silicon oxide surfaces. The wafer surfaces then undergo an activation treatment, for example plasma activation in nitrogen under partial vacuum, and are then cleaned using, for example, an aqueous megasonics cleaning technique (step 102).

After activation and cleaning, the wafers are loaded to the initial bonding chucks and aligned (step 104). FIG. 3 is a cross-sectional view showing a pair of cleaned and activated wafers 300 and 302 loaded to initial bonding chucks 304 and 306, in accordance with an embodiment of the present invention. As illustrated, top wafer 300 may be loaded and aligned on top chuck 304, and may be held in an aligned position on the chuck face of top chuck 304 by a vacuum applied to vacuum channels, such as vacuum channel 308. In preferred embodiments, top chuck 304 may be a typical flat bonding chuck. Similarly, bottom wafer 302 may be loaded and aligned on the chuck face of bottom chuck 306, and may be held in an aligned position on the chuck face of bottom chuck 306 by a vacuum applied to vacuum channels, such as vacuum channel 310. In preferred embodiments, bottom chuck 306 is not a typical flat bonding chuck. Rather, the chuck face of bottom chuck 306 may be predominantly flat with an annular edge zone that slopes away from top bonding chuck 304 in an annular edge zone region 312. In preferred embodiments of the invention, bottom wafer 302 may be held in place against the chuck face of edge-sloped bottom chuck 306 by vacuum channels 310 such that an annular edge zone of bottom wafer 302 is biased away from the bonding face of top wafer 300. In certain embodiments, bottom wafer 302 may be held in place against the chuck face of edge-sloped bottom chuck 306 by vacuum channels, electrostatic force, other releasable attractive or clamping means, or a combination of these.

After wafers 300 and 302 are loaded to the initial bonding chucks 304 and 306 and aligned (step 104), an initial room temperature bonding process may be performed (step 106) utilizing the combination of the typical flat bonding chuck 304 and the edge-sloped bonding chuck 306, in accordance with embodiments of the invention as illustrated in FIG. 3. In the initial room temperature bonding process, top and bottom bonding chucks 304 and 306, respectively, are brought within proximity of each other. The center of top wafer 300 may be biased downward, for example, by a center pin (not shown) that may be extended downward through top chuck 304, so that the bonding face of top wafer 300 contacts the bonding face of bottom wafer 302. The vacuum on all vacuum channels 308 in top chuck 304 may then be released, and top wafer 300 snaps down onto bottom wafer 302. A radial van der Waals force bonding wave propagates outward from the initial center contact point of top and bottom wafers 300 and 302, respectively, and an initial van der Waals force bond is formed between the wafer bonding faces.

FIG. 4 is a cross-sectional view showing the pair of wafers 300 and 302 in an initial van der Waals force bonding state, in accordance with an embodiment of the present invention. As illustrated, bottom wafer 302 may be held in place against edge-sloped bottom chuck 306 by a vacuum applied to vacuum channels 310. Top wafer 300, having been released from top chuck 304, has formed a van der Waals force initial bond with bottom wafer 302 over their opposing bonding faces, except in the annular edge zone 312 of bottom wafer 302 that is biased away from the bonding face of top wafer 300. The annular edge zone 312 of bottom wafer 302 that is biased away from the bonding face of top wafer 300 defines an edge gap 400 that is characterized as an annular zone in which top and bottom wafers 300 and 302 are not bonded to each other, and the wafers are not in contact with each other.

FIG. 5 is a cross-sectional view showing wafers 300 and 302 released from the initial bonding chucks 304 and 306 and in the initial van der Waals force bonding state, in accordance with an embodiment of the invention. As explained below in more detail with respect to step 108 of FIG. 1, the bonded wafer pair is ready for a thermocompression and permanent anneal bonding processes, that may be performed utilizing flat bonding chucks. As illustrated in FIG. 5, no biasing forces are acting on top and bottom wafers 300 and 302, respectively. This allows the annular edge zone 312 of bottom wafer 302 to relax to a position closer to the annular edge zone 312 of top wafer 300, however, an edge gap 400 remains between bottom wafer 302 and top wafer 300. The opposing bonding surfaces of wafers 300 and 302 are in an initial bond state, except in the annular edge zone 312. In the edge zone 312, the bonding faces of wafers 300 and 302 may not be fully bonded to each other, or may be only weakly bonded as characterized by significantly fewer van der Waals bonding sites in comparison to the inner radial portions of the wafer pair that have been subject to the van der Waals bonding wave, and, at least in an outer portion of edge zone 312, are separated by edge gap 400.

In embodiments of the invention, annular edge zone 312 of the chuck face of bottom chuck 306 has a radial dimension and an edge-slope profile sufficient to disrupt the van der Waals bonding wave, and, when the bonded wafer pair has been released from bottom chuck 306, to allow at least an outer radial portion of edge zone 312 of wafers 300 and 302 to remain unbounded or weakly bonded, and to allow edge gap 400 between the initially bonded wafers to have a separation between bond faces of at least several nanometers at the outer portion of edge gap 400. As will be explained in more detail below, having an unbonded annular edge zone with at least several nanometers of separation between the wafer bond faces may facilitate the degassing from the wafer-wafer interspace, particularly at the edge zone, when a vacuum is applied in the tool chamber of air and water vapor molecules that may have diffused into the interspace or were present at the time of initial bonding, or may be created as reaction byproducts of a thermocompression process, described below with relation to step 108 of FIG. 1.

In various embodiments of the invention, edge zone 312 of the chuck face of bottom chuck 306 has a radial annular width range of between approximately 0.5 mm and approximately 10 mm, as measured from the extant radial dimension of the wafer bonding faces. More preferably, the radial annular width ranges between approximately 3 mm and approximately 5 mm. Regarding the profile of the edge slope, changes in slope may occur with a sufficiently large radius of curvature so as not to subject the wafer to sharp bends that may cause damage to the wafer when the wafer edge is vacuum biased to the chuck face. The edge slope profile can include a constant or variable radius arc, such as a decreasing radius arc, or a linear portion with a curved transition from the flat inner chuck region. Generally, the edge slope profile may be a linear portion with a curved transition from the flat inner chuck region, sufficient to create a gap between the wafer bond faces at the extant radial range of the bond faces of between 1 nanometer and several hundred microns, more preferably between 5 nanometers and 10 microns, and most preferably between 10 nanometers and 1 micron.

After initial van der Waals force bonding (step 106), the wafer pair undergoes a thermocompression bonding process (step 108). This process may be performed on the initial bonded wafer pair between flat chucks. FIG. 6 is a cross-sectional view showing the pair of initial bonded wafers 300 and 302 loaded to flat bonding chucks 600 and 602, which may include vacuum channels 604 and 606, respectively, in preparation for the thermocompression bonding processes, in accordance with an embodiment of the present invention. As illustrated, wafers 300 and 302 are in an initial van der Waals force bonding state, with an edge gap 400 separating the wafers in edge zone 312.

The thermocompression bonding step enhances the initial van der Waals wafer-wafer bond prior to the final permanent anneal bonding step. In embodiments of the invention, a thermocompression bonding step operates to: strengthen the van der Waals bond between the wafers; initiate a low temperature condensation of silanol groups on the oxide surfaces; facilitate by chamber vacuum and thermal energy the outgassing of air, water vapor resulting from initial silanol condensation, and contaminant molecules that may be present between the initial bonded wafers; and operates to form a high quality van der Waals bond between the wafers in edge zone 312 that has significantly fewer bonding defects than may be present after a typical initial bonding process.

Figure 2:
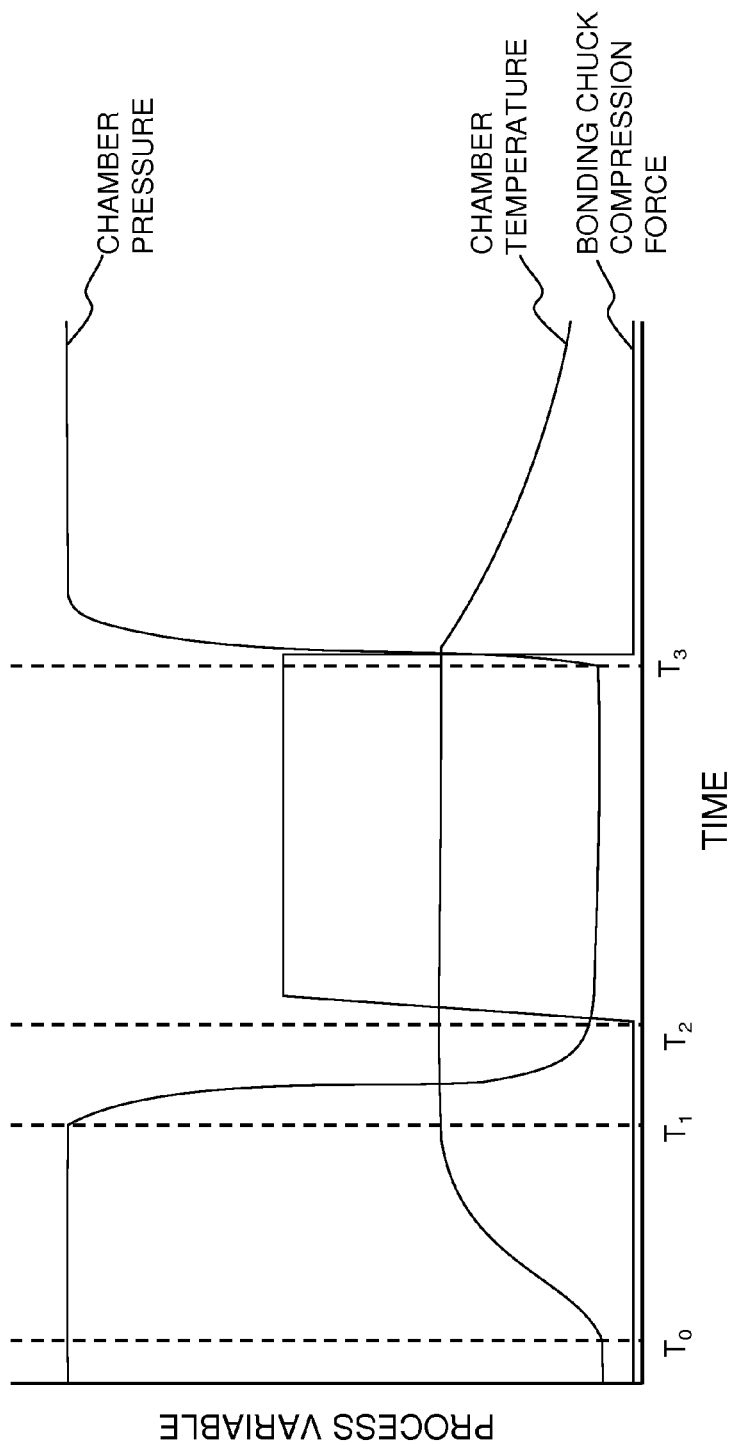
FIG. 2 is a process recipe graph illustrating the thermocompression bonding step of the oxide-oxide fusion bonding process of FIG. 1, in accordance with an embodiment of the present invention.

FIG. 2 is a process recipe graph illustrating the thermocompression bonding process of step 108, FIG. 1, in accordance with an embodiment of the present invention. The process recipe includes three process variables: tool chamber air pressure, tool chamber temperature, and bonding chuck compression force. As illustrated, at time $T_o$, the chamber pressure is at ambient atmospheric pressure, no bonding chuck compression force is being applied, and the heating of the tool chamber from ambient room temperature has begun. At time $T_1$, the tool chamber has reached a temperature of between approximately 120° C. and approximately 150° C. In an exemplary embodiment, the time interval between $T_o$ and $T_1$ may be approximately 10 minutes to approximately 15 minutes. In embodiments of the invention, the thermocompression process temperature is sufficient to at least initiate condensation reactions of silanol groups on the oxide surfaces of the wafers, which results in the formation of (—O—)$_3$Si—O—Si(—O—)$_3$ bonds between the wafer surfaces, and the formation of condensation reaction generated H$_2$O molecules. The chamber temperatures at $T_1$ and $T_2$ are not high enough, e.g., not greater than approximately 250° C., to significantly cause deactivation of the activated wafer surfaces such that the wafer surfaces cannot bond to each other through condensation reactions when compression force is applied. Depending on the composition of the wafer surfaces, the cleaning and activation processes, the composition of the tool chamber atmosphere, and other process variables, the chamber temperature required to initiate condensation of silanol groups on the oxide surfaces can vary. Although the chamber temperature is represented by a single profile line, in certain embodiments, the process recipe can include multiple temperature variables, for example, top and bottom chamber temperatures.

Also at time $T_1$, evacuation of the tool chamber atmosphere begins, with evacuation complete at time $T_2$. Application of a vacuum to the chamber atmosphere results in the substantial removal of air and contaminant molecules from the wafer-wafer interspace by diffusion of the molecules through edge gap 400. Similarly, water molecules resulting from silanol condensation reactions between the wafer oxide surfaces in the initially bonded areas may also be removed, which, in accordance with Le Chatelier's Principle, has the effect of pushing the condensation reaction equilibrium forward. In an exemplary embodiment, the chamber atmosphere pressure may be reduced to approximately $10^{-2}$ to approximately $10^{-5}$ mbar or less, and the time interval between $T_1$ and $T_2$ may be approximately 5 minutes to approximately 15 minutes.

Also at $T_2$, a compression force is applied to bonding chucks 600 and 602. The compression force acts to facilitate the silanol condensation reaction between the wafer oxide surfaces, with the accompanying water vapor reaction byproduct, by bringing the wafer surfaces closer together (approximately within several angstroms). The compression force also acts to substantially eliminate edge gap 400 such that, at the end of the compression interval, the wafer surface separation in edge zone 312 is substantially the same as the wafer separation in the interior area of the bonded wafer pair. In a preferred embodiment, water vapor produced by silanol condensation reactions facilitated during the compression interval may be substantially removed from the wafer-wafer interspace through edge gap 400 through vacuum diffusion by the end of the compression interval, when edge gap 400 has been substantially eliminated. In an exemplary embodiment, a compression force of approximately 1 kN to approximately 75 kN is applied for approximately 1 to approximately 15 minutes. Based on the specific characteristics of wafers 300 and 302, such as composition, structures built in and on the wafers, wafer thickness, etc., applying a lesser compression force for a longer interval may be more preferable. In certain embodiments, the compression force can vary over the compression interval. For example, the compression force can begin at an initial value and increase to a final value over the compression interval. At time $T_3$, the vacuum in the tool chamber is released, the bonding chuck compression force is removed, and the chamber temperature can return to ambient room temperature.

In preferred embodiments, the thermocompression bonding process recipe variables interoperate to remove air, contaminant, and silanol condensation reaction byproduct molecules from the wafer-wafer interface and "seal" edge gap 400 such that such molecules may not be generated and accumulate in the edge zone during the permanent anneal step and generate edge defects. FIG. 7 is a cross-sectional view showing the pair of bonded wafers 300 and 302 after the thermocompression bonding process, in accordance with an embodiment of the present invention. As illustrated, edge zone 312 of wafer pair 300 and 302 is "sealed", and an edge gap is not present.

After the thermocompression bonding process (step 108), the wafer pair undergoes a final permanent anneal bonding process (step 110). In embodiments of the invention, the permanent anneal bonding process can occur at temperatures and durations less than the typical permanent anneal bonding process. Because the thermocompression process has resulted in a lower wafer oxide surface separation and a higher silanol condensation level than a typical initial van der Waals bonding process, the temperature and duration of the permanent anneal bonding process can both be lower than if there were no intermediate thermocompression process in accordance with embodiments of the invention. The compression force applied during the thermocompression step brings the wafer surfaces closer together than if there were no compression force applied. As a result, the bonding kinetics may be facilitated due to the increased probability of collision between adjacent silanol groups during the condensation reaction. As a result, the thermocompression step may achieve a certain degree of interfacial chemical bonding and reduce the required duration and temperature of the permanent anneal step. In addition, the reduced wafer interspace after the thermocompression step may facilitate the bonding kinetics during the permanent anneal. In an exemplary embodiment, the permanent anneal bonding process may have a maximum temperature value of approximately 250° C., as opposed to a typical final anneal bonding process temperature of 300° C. or greater, and the process duration may be approximately 60 minutes, as opposed to the typical final anneal process duration of 2 hours or more. The advantages of a lower process temperature and a shorter duration may include a lower thermal budget, faster process cycle times, or less damage or thermal distortion the wafers. For wafer multi-stacking integration schemes, the advantages may also include a reduced cumulative thermal exposure on wafer stacks, which may improve the reliability degradation rick for such multiple layer structures.

Figure 10:
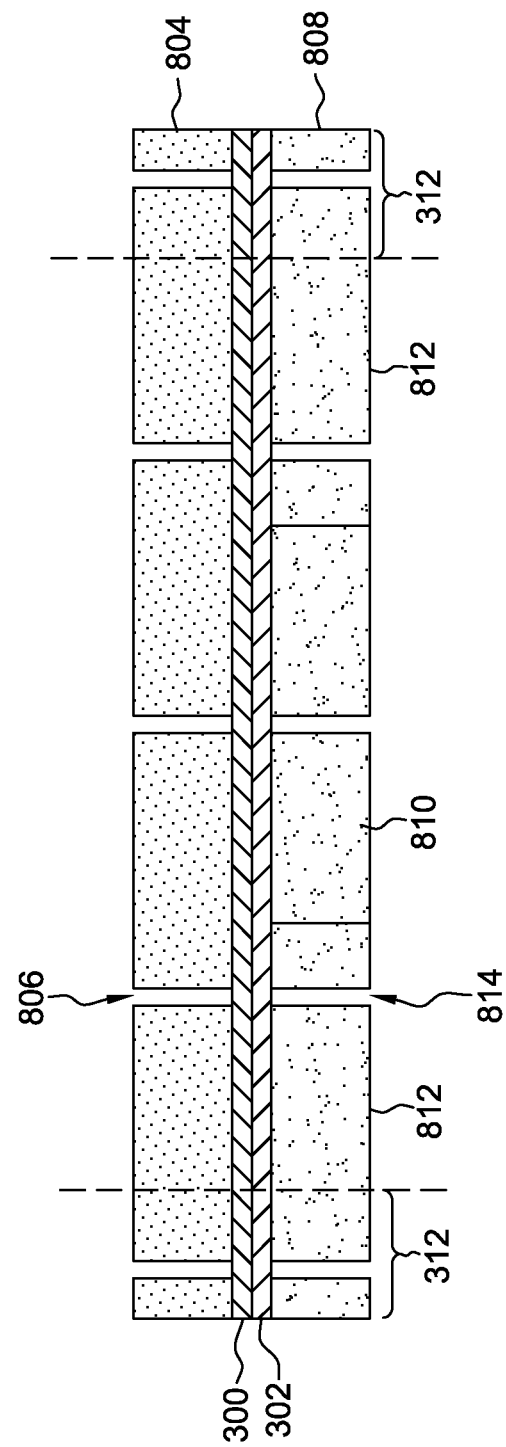

FIGS. 8, 9, and 10 are cross-sectional views showing an adjustable dual-zone bonding chuck that is an alternative to edge-sloped bonding chuck 306 of FIG. 3, in accordance with an embodiment of the present invention. Adjustable dual-zone bonding chuck 808 has a central zone 810 surrounded by an outer zone 812. Bonding chuck zones 810 and 812 move relative to each other in a shear direction along an axis that may be perpendicular to the chuck face planar surfaces of chuck zones 810 and 812. In embodiments of the invention, central chuck zone 810 can be in a raised position or a lowered position relative to the chuck face of outer chuck zone 812. In certain embodiments, the chuck face edges of chuck zones 810 and 812 may be chamfered or radiused so as to reduce stress in wafer 302 across the boundary between chuck zones 810 and 812. In preferred embodiments, the movement of chuck zones 810 and 812 may be controlled, for example, by a precision hydraulic piston arrangement, so as to allow for movements in the approximately 0.1 micron to approximately 1 micron range with a relative movement between chuck zones 810 and 812 in the approximately 0.1 micron to approximately 100 micron range.

As illustrated in FIG. 8, wafers 300 and 302 have been prepared for bonding (see step 100, FIG. 1), have been activated and cleaned (see step 102), have been aligned in bonding chucks 804 and 808 and are held in position against the chuck faces by, for example, vacuum channels such as vacuum channels 806 and 814 (see step 104), and are ready for the initial room temperature bonding process (see step 106). As illustrated, central zone 810 and outer zone 812 of adjustable dual-zone bonding chuck 808 are in relative positions such that chuck face portion of central zone 810 is in a raised position relative to the chuck face portion outer zone 812. In this positional relationship, at least edge zone 312 of bottom wafer 302 is biased away from the edge zone 312 of upper wafer 300, in accordance with the description above in relation to FIG. 3 and edge-sloped bonding chuck 306. In certain embodiments, bottom wafer 302 may be held in place against the chuck face of adjustable dual-zone bonding chuck 808 by vacuum channels, electrostatic force, other releasable attractive or clamping means, or a combination of these.

FIG. 9 is a cross-sectional view showing wafers 300 and 302 in an initial van der Waals bond state, in accordance with an embodiment of the present invention. As illustrated, bottom wafer 302 may be held in place against the chuck face of adjustable dual-zone bonding chuck 808 by a vacuum applied to vacuum channels, such as vacuum channel 814. Top wafer 300, having been released from top chuck 804, has formed a van der Waals force initial bond with bottom wafer 302 over their opposing bonding faces, except in the annular edge zone 312 of wafers 300 and 302. In edge zone 312, bottom wafer 302 is biased away from the bonding face of top wafer 300 and defines an edge gap 400 that may be characterized as an annular zone in which top and bottom wafers 300 and 302 are not bonded to each other and the wafers are not in contact with each other, in accordance with the description above with relation to FIG. 4 and edge gap 400.

FIG. 10 is a cross-sectional view showing the pair of bonded wafers 300 and 302 after the thermocompression bonding process, in accordance with an embodiment of the present invention. As illustrated, edge zone 312 of wafer pair 300 and 302 is "sealed," and an edge gap between the wafers is not present. Central zone 810 and outer zone 812 of adjustable dual-zone bonding chuck 808 are now in relative positions such that the chuck face portions of chuck zones 810 and 812 are coplanar.

In exemplary embodiments of the invention, central zone 810 and outer zone 812 may be adjusted to be in relative positions such that the chuck faces of chuck zones 810 and 812 are coplanar after the initial room temperature bonding process described in relation to step 106 of FIG. 1. With central zone 810 and outer zone 812 in a coplanar relationship, wafers 300 and 302 undergo the thermocompression bonding process and the permanent anneal bonding process, as described in relation to steps 108 and 110 of FIG. 1. In certain embodiments, central zone 810 and outer zone 812 can be adjusted to a coplanar relationship during the thermocompression bonding process, for example, after heating and evacuation of the tool chamber, and before the application of the bonding chuck compression force. See, e.g., time $T_2$, FIG. 2. In certain situations, this may enhance the degassing of molecules in the interspace between the wafer pair.

Figure 11:
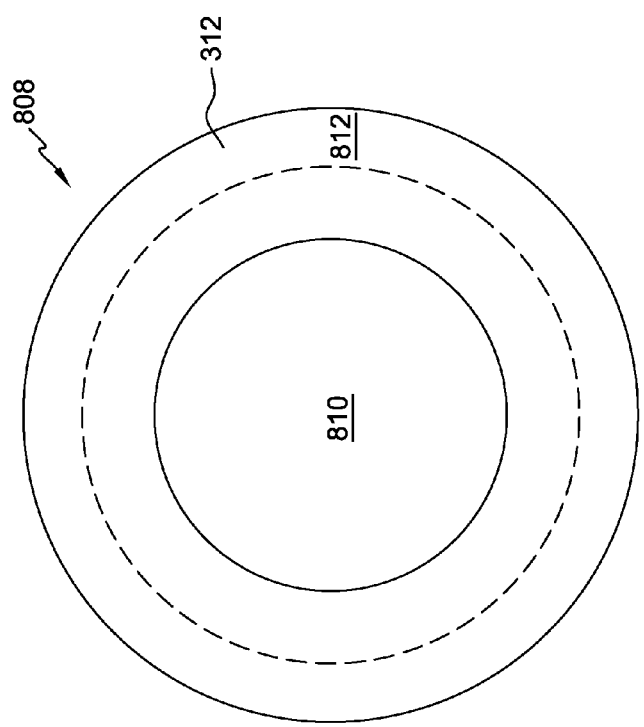
FIG. 11 is a plan view of the adjustable dual-zone bonding chuck of FIG. 8, in accordance with an embodiment of the invention.
Figure 12:
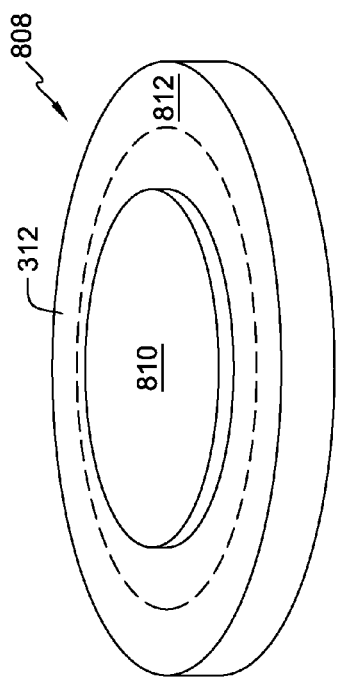
FIG. 12 is a perspective view of adjustable dual-zone bonding chuck of FIG. 8, in accordance with an embodiment of the invention.

FIGS. 11 and 12 are plan and perspective views, respectively, of adjustable dual-zone bonding chuck 808, in accordance with an embodiment of the invention. As illustrated, central zone 810 is in a raised position relative to the chuck face of outer chuck zone 812. Edge zone 312 is delimited by a dashed line on the figures.

In preferred embodiments, at least central chuck zone 810 may be circular to allow for an annular edge zone 312. In other embodiments, central chuck zone 810, and the corresponding void in outer chuck zone 812 in which central chuck zone 810 moves, can be non-circular in shape to accommodate specific design and process requirements of certain wafers. In certain embodiments, both top chuck 804 and bottom chuck 808 can be adjustable dual-zone bonding chucks.

The adjustable dual-zone bonding chuck 808, in combination with, for example, another such chuck, an adjustable multi-zone chuck as described below, or a typical flat chuck, may allow for bonding processes in which uniform or non-uniform compression forces can be applied to a wafer pair. A force over time profile for each chuck zone can also be defined. Incremental bonding of certain areas of the wafer pair can also be done.

In addition to meeting the functional requirements and advantages of the unitary design of edge-sloped chuck 306, as described above in relation to FIGS. 3 and 4, adjustable dual-zone bonding chuck 808 has other advantages. For example, using an adjustable dual-zone bonding chuck, such as chuck 808, as the bottom chuck in the oxide-oxide fusion bonding process, such as described with relation to FIG. 1, can eliminate the requirement to remove initially bonded wafer pair 300 and 302 from edge-sloped bonding chuck 306, swap out chuck 306 for a flat bonding chuck, such as chuck 602 in FIG. 6, load the wafer pair to the flat chuck, and perform thermocompression and permanent anneal processes, such as those described in relation to steps 108 and 110 of FIG. 1. This may reduce the number of chucks required to be resident in the wafer bonding tool. In addition, bonding chuck compression forces can be applied with different magnitudes and different force-over-time profiles for central chuck zone 810 and outer chuck zone 812 during and between various process steps of the oxide-oxide fusion bonding process.

Figure 13:
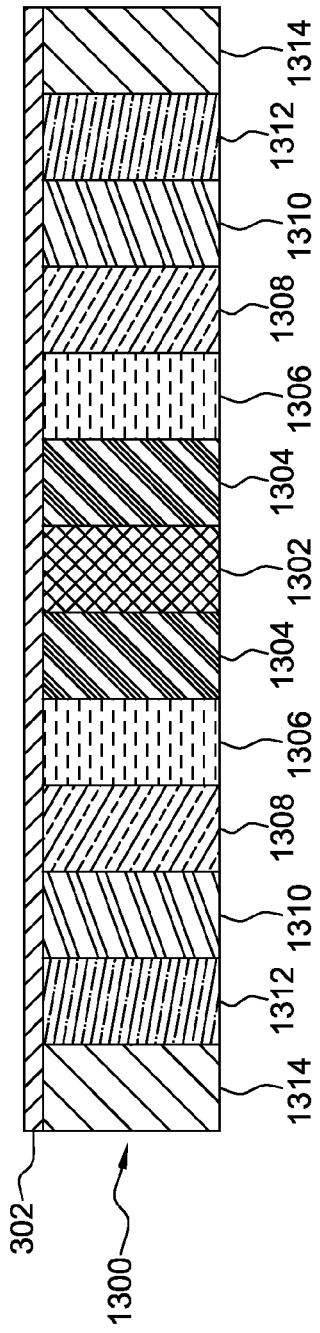
FIGS. 13 and 14 are cross-sectional views showing an adjustable multi-zone bonding chuck that may be an alternative to edge-sloped bonding chuck of FIG. 3, and the adjustable dual-zone bonding chuck of FIG. 8, in accordance with embodiments of the present invention.
Figure 14:
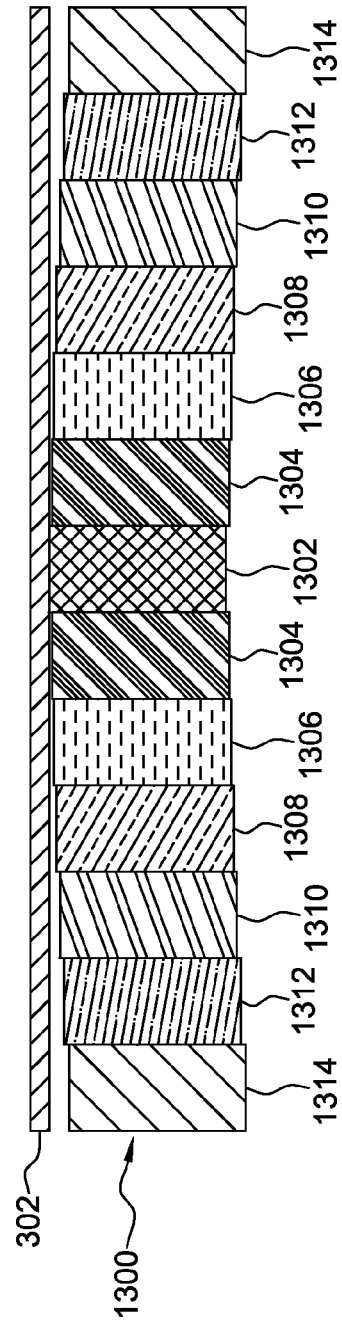

FIGS. 13 and 14 are cross-sectional views showing an adjustable multi-zone bonding chuck 1300 that may be an alternative to edge-sloped bonding chuck 306 of FIG. 3, and adjustable dual-zone bonding chuck 808 of FIG. 8, in accordance with an embodiment of the present invention. As illustrated, adjustable multi-zone bonding chuck 1300 has a central zone 1302 surrounded by multiple annular outer zones 1304 to 1314. Bonding chuck zones 1302 to 1314 may move relative to each other in a shear direction along an axis that may be perpendicular to the planar surfaces of the chuck faces of the chuck zones. In various embodiments of the invention, each chuck zone can be raised or lowered relative to the other chuck zones. In certain embodiments, the chuck face edges of chuck zones 1302 to 1314 may be chamfered or radiused so as to reduce stress in wafer 302 across the boundary between chuck zones. In preferred embodiments, the movement of chuck zones 1302 to 1314 may be controlled, for example, by a precision hydraulic piston arrangements, so as to allow for movements in the approximately 0.1 micron to approximately 1 micron range with a movement of chuck zones 1302 to 1314 in the approximately 0.1 micron to approximately 100 micron range. In certain embodiments, one or more chuck zones 1302 to 1314 may have vacuum channels (not shown), electrostatic force, or other releasable means for holding a wafer in place against the chuck face of the chuck.

FIG. 13 is a cross-sectional view showing chuck zones 1302 to 1314 of adjustable multi-zone bonding chuck 1300 in a planar relationship with respect to the surface of each chuck zone that contacts wafer 302. FIG. 14 is a cross-sectional view showing chuck zones 1302 to 1314 of adjustable multi-zone bonding chuck 1300 in a center-arched positional arrangement, relative to a reference plane provided by lower wafer 302, in which each chuck zone is in a lower position relative to the next chuck zone nearer central chuck zone 1302.

In a different positional arrangement, all chuck zones except for the outer chuck zone 1314 can be in a planar positional relationship, and outermost chuck zone 1314 can be in a lowered relationship the other chuck zones. This positional arrangement would result in a cross-sectional profile similar to that of edge-sloped chuck 306 of FIG. 3, and adjustable dual-zone bonding chuck 808 of FIG. 8 when central chuck zone 810 is in a raised positional relationship with respect to outer chuck zone 812.

Because each chuck zone can be adjusted to a raised, lowered, or planar positional relationship to the other chuck zones, a variety of symmetric cross-sectional profiles are possible. In other embodiments, chuck zones 1304 to 1314 can be segmented into annular sectors to allow for additional chuck face surface profiles. In other embodiments of the invention, the chuck zones can be in arrangements of regular, irregular, or arbitrary shapes that tile the plane of a chuck face, with one or more chuck zones able to be precision raised or lowered with respect to another of the chuck zones along an axis that can be perpendicular to the overall plane of the chuck face, tilted with respect to the overall plane of the chuck face, or a combination of these movements. In certain embodiments, a chuck zone can be circular, and movement of the chuck zone can be a rotational movement in the plane of the chuck face. Such an arrangement of chuck zones can allow for any desired chuck face surface profile, and precision movement between chuck face surface profiles, as may be required during bonding, planarization, or other chip fabrication processes.

The adjustable multi-zone bonding chuck 1300, in combination with, for example, another such chuck, an adjustable dual-zone chuck as described above, or a typical flat chuck, also allows for bonding processes in which uniform or non-uniform compression forces can be applied to a wafer pair. A force over time profile for each chuck zone can also be defined. Incremental bonding of certain areas of the wafer pair can also be done.

Similar to adjustable dual-zone bonding chuck 808 described above, the advantages of adjustable multi-zone bonding chuck 1300 can also include using the chuck in several chip fabrication processes that may previously have required different chucks. This may reduce the number of chucks required to be resident in the wafer bonding tool.

Detailed embodiments of the claimed methods and structures are disclosed herein. However, it is to be understood that the disclosed embodiments are merely illustrative of the claimed structures and methods that may be embodied in various forms. In addition, each of the various disclosed embodiments is intended to be illustrative, and not restrictive. Further, the figures are not necessarily to scale, and some features may be exaggerated to show details of particular components. Specific structural and functional details disclosed herein are not to be interpreted as limiting, but merely as a representative basis for teaching one skilled in the art to variously employ the methods and structures of the present disclosure. Numerous modifications and substitutions can be made without deviating from the scope of the present invention. Therefore, the present invention has been disclosed by way of example and not limitation.

What is claimed is:

1. A method for oxide-oxide fusion bonding of two wafers, a bonding surface of each wafer being prepared for oxide-oxide fusion bonding, the method comprising:
   performing a van der Waals force bonding process between the bonding surfaces of the first and second wafers by at least:
   mounting on a first chuck face of a first chuck a first wafer having a bonding surface facing away from the first chuck face;
   mounting on a second chuck face of a second chuck a second wafer having a bonding surface facing away from the second chuck face, the second chuck face including at least a flat central zone and an outer annular zone contiguous to the central zone, the outer annular zone being lower than the flat central zone such that an annular edge portion of the bonding surface of the second wafer that is mounted to the outer annular zone of the second chuck face is biased towards the outer annular zone;
   while the bonding surfaces of the first and second wafers are in opposed aligned close proximity to each other, biasing a center portion of the first wafer towards the second wafer such that a center portion of the bonding surface of the first wafer contacts a center portion of the bonding surface of the second wafer, and
   releasing the first wafer from the first chuck, whereby the first wafer snaps against the second wafer forming a van der Waals bonding wave propagating radially outward from the center contact portions of the bonding surfaces that is disrupted upon reaching the annular edge portion of the bonding surface of the second wafer that is biased towards the outer annular zone of the second chuck face, the annular edge portion of the bonding surface of the second wafer and a corresponding annular edge portion of the bonding surface of the first wafer defining an edge gap between the annular edge portions;

mounting the van der Waals force bonded first and second wafers between a third chuck having a flat chuck face, and a fourth chuck having a flat chuck face;

in a process chamber, performing a thermocompression bonding process between the bonding surfaces of the first and second wafers by at least:
heating the first and second wafers to a temperature at least sufficient to initiate condensation of silanol groups between the bonding surfaces of the first and second wafers;
reducing the pressure of the atmosphere in the process chamber;
applying a compression force to the first and second wafers with the third and fourth chucks so as to substantially eliminate the edge gap; and
performing a permanent anneal bonding process between the bonding surfaces of the first and second wafers.

2. A method in accordance with claim 1, wherein the cross-sectional profile of the outer annular zone of the second chuck face results in an edge gap, measured just prior to mounting the van der Waals force bonded first and second wafers between the third chuck and the fourth chuck, having an annular radial width of between approximately 0.5 mm and approximately 10 mm, and a separation between the wafer bonding faces at the extant radial dimensions of the wafer bonding faces of between approximately 1 nm and 100 microns.

3. A method in accordance with claim 1, wherein the outer annular zone of the second chuck face has a radial annular width of between 0.5 mm and 10 mm.

4. A method in accordance with claim 1, wherein
the second chuck has a chuck face comprising a flat central zone surrounded by a contiguous flat outer zone that moves relative to the central zone along an axis that is perpendicular to the central zone, and
wherein the outer zone is positioned lower than the flat central zone such that an annular edge portion of the bonding surface of the second wafer that is mounted to the outer annular zone of the second chuck face is biased towards the outer annular zone, and
wherein the fourth chuck is the second chuck with the central zone and the outer zone in a coplanar positional relationship.

5. A method in accordance with claim 1, wherein heating the first and second wafers comprises heating the first and second wafers to a temperature between approximately 120° C. and approximately 150° C.

6. A method in accordance with claim 1, wherein reducing the pressure comprises reducing the pressure of the atmosphere in the process chamber to between approximately $10^{-2}$ to approximately $10^{-5}$ mbar.

7. A method in accordance with claim 1, wherein applying a compression force comprises applying a compression force to the first and second wafers of between approximately 1 kN and approximately 75 kN for approximately 1 minute to approximately 15 minutes.

8. A method in accordance with claim 1, wherein performing a permanent anneal bonding process comprises heating the first and second wafers to approximately 250° C. for a period of approximately 15 minutes to approximately 60 minutes.

9. A method in accordance with claim 1, wherein at least one bonding surface comprises: a deposited silicon oxide layer, or an intrinsic silicon oxide surface.

10. A method in accordance with claim 1, wherein each of the bonding surfaces of the first and second wafers comprise: a silicon wafer with a deposited silicon oxide layer, or a glass substrate with an intrinsic silicon oxide surface.

* * * * *